United States Patent [19]

Roudeski

[11] Patent Number: 4,764,708

[45] Date of Patent: Aug. 16, 1988

[54] TOUCH CONTROL LAMP SOCKET INTERIOR

[76] Inventor: Charles A. Roudeski, 97 Willow Wood Cir., Urbana, Ohio 43078

[21] Appl. No.: 938,827

[22] Filed: Dec. 8, 1986

[51] Int. Cl.$^4$ .......................... H01J 7/44; H01J 19/28; H01J 29/96; H01J 17/34
[52] U.S. Cl. ......................................... 315/51; 315/53; 315/72; 315/149; 315/362; 315/DIG.4; 307/116; 307/125; 307/157; 307/308; 200/DIG.1
[58] Field of Search ............... 307/116, 125, 157, 308, 307/247 R; 200/DIG. 1; 315/362, 74, 72, DIG. 4, 227 R, 51, 53, 149, 194

[56] References Cited

U.S. PATENT DOCUMENTS

| | | | |
|---|---|---|---|
| 2,206,217 | 7/1940 | Barry | 315/362 |
| 2,953,769 | 9/1960 | Woofter et al. | 315/DIG. 4 X |
| 3,165,371 | 1/1965 | Ruocco | 313/318 |
| 3,300,711 | 1/1967 | Duncan | 339/78 |
| 3,543,088 | 11/1970 | Garrett | 315/272 |
| 3,896,334 | 7/1975 | Rodriquez | 315/194 |
| 4,101,805 | 7/1978 | Stone | 315/74 |
| 4,183,604 | 1/1980 | Tjornhom, Sr. | 315/72 |
| 4,211,959 | 7/1980 | Deavenport et al. | 315/362 |
| 4,237,386 | 12/1980 | Instance | 307/116 |
| 4,250,432 | 2/1981 | Koehler | 315/291 |
| 4,490,625 | 12/1984 | Dilly | 307/116 |
| 4,613,790 | 9/1986 | Roorda | 315/72 |
| 4,668,887 | 5/1987 | Kunen | 307/116 |

Primary Examiner—David K. Moore
Assistant Examiner—Mark R. Powell
Attorney, Agent, or Firm—Killworth, Gottman, Hagan & Schaeff

[57] ABSTRACT

An electric touch control light socket used to convert a lamp to touch-sensitive use which includes a circuit housing and a light bulb insertion socket mounted thereto which together are adapted for installation within a standard light socket shell of a lamp in place of a standard light socket. A touch sensing circuit in the circuit housing has a self-compensating subcircuit to eliminate the effects of slower changing ambient capacitance of the lamp in order to detect touching of the lamp by monitoring rapid changes in lamp capacitance. A spring contact connected to the circuit is attached to the circuit housing and projects along a side thereof for placement between the circuit housing exterior and the interior surface of the light socket shell and in electrical contact with a conductive portion of the light socket shell when the circuit housing and insertion socket are installed within the light socket shell. The spring contact thereby is inaccessible from the exterior of the lamp and is adapted to convey to the circuit an electrical touch-responsive input signal generated when a person touches a conductive exterior portion of the lamp connected to the conductive portion of the light socket shell. The circuit has an operating mode control subcircuit actuable by a manually-operable control knob for selecting the operating mode of the circuit, e.g. ON/OFF, 4-Level, or 5-Level dimmer sequences.

18 Claims, 4 Drawing Sheets

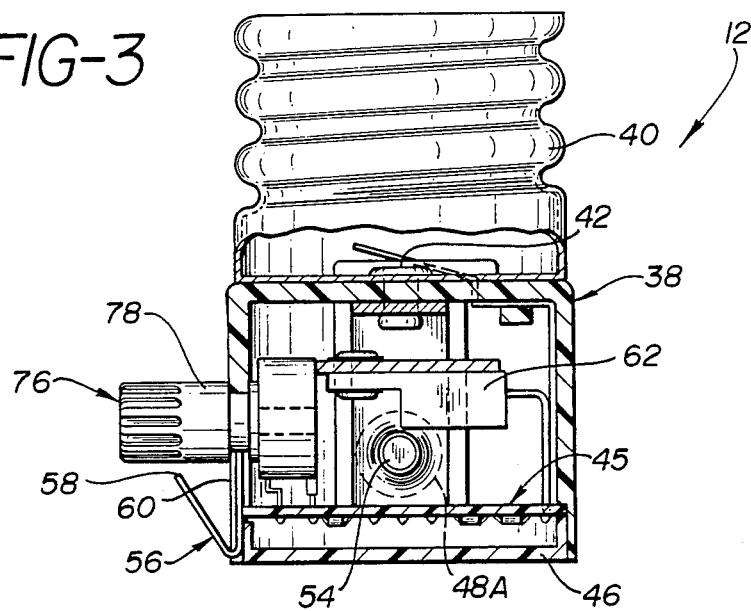
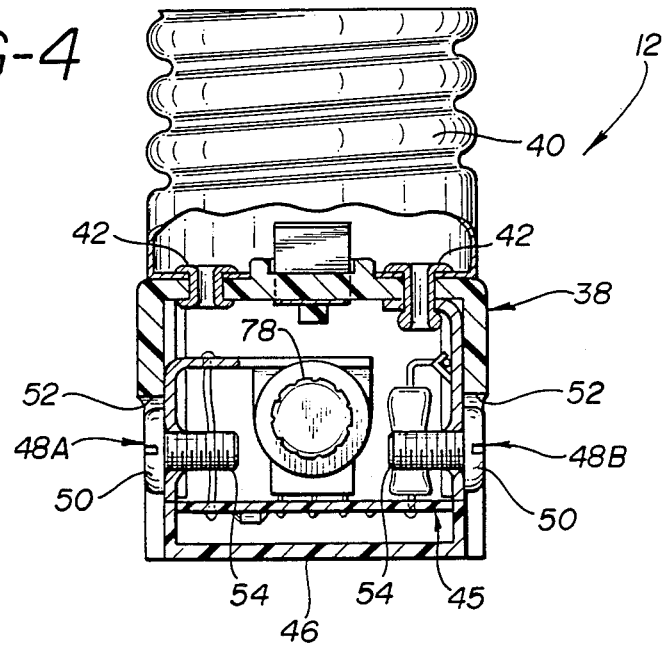

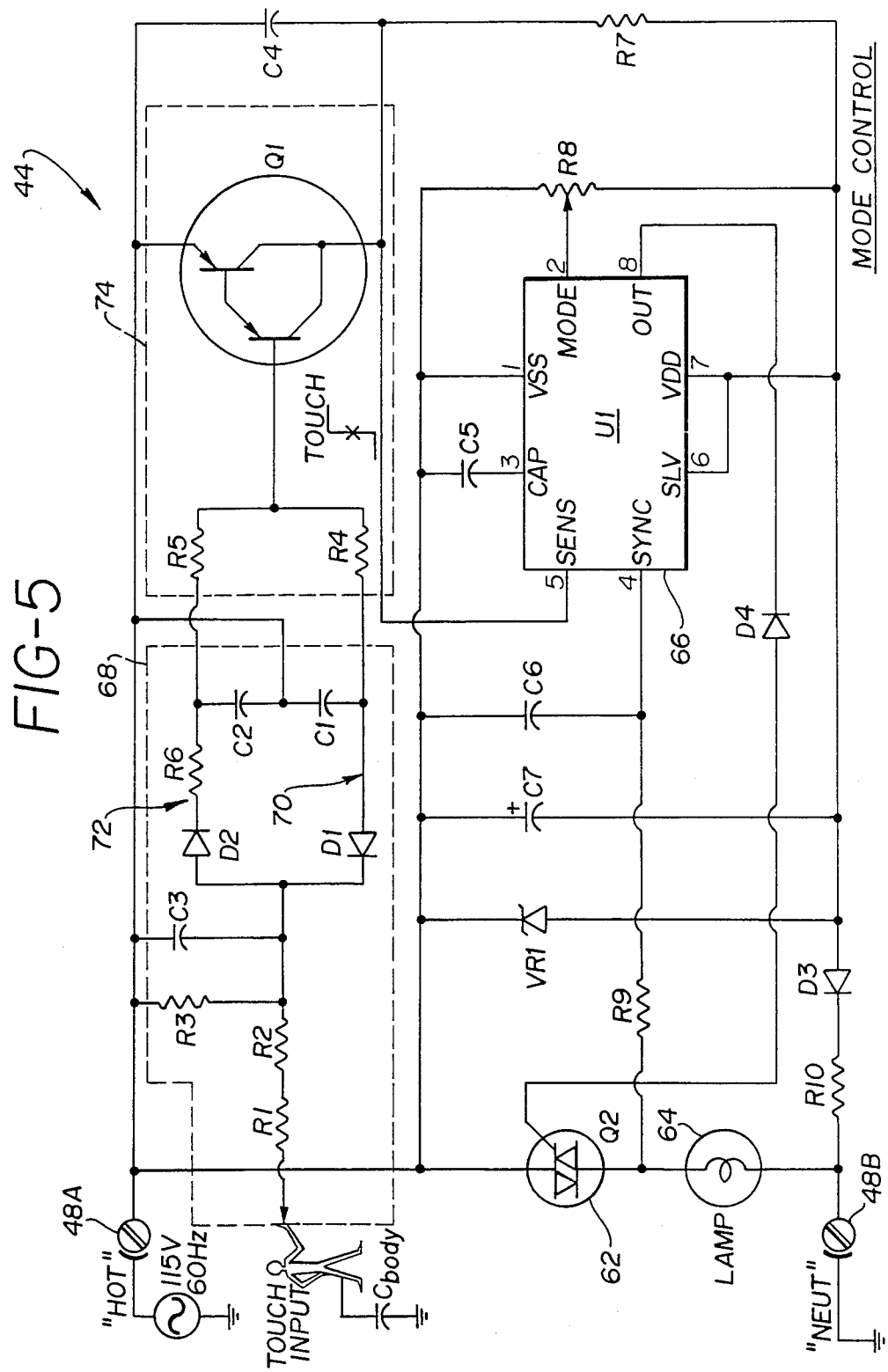

TOUCH CONTROL LAMP SOCKET INTERIOR

BACKGROUND OF THE INVENTION

The present invention generally relates to conversion of a lamp to touch control and, more particularly, to an electronic touch control light socket for conversion of ordinary lamps, such as a table lamp, to touch control which installs directly in the lamp in place of an ordinary light socket, and is "wireless" in the sense that the device eliminates all wiring related to touch control conversion.

Touch control lamps, both on/off and dimming types, have grown in popularity over the years, offering solid-state control of the lamp with a touch of the lamp's metallized body parts. Touch controls are quick and convenient, and especially ideal for pre-schoolers and physically disabled persons, such as arthritics, who find it difficult, in view of their limited dexterity, to operate conventional light switches.

One prior art approach for converting a table lamp to touch control, such as disclosed in U.S. Pat. No. 4,237,386 to Instance, is to package the touch control circuit in a separate, bulky module. The module can be applied to either a wall socket or mounted on the base of the lamp. Base mounting, however, embodies several disadvantages. It requires several wire connections to provide power to and from the module, as well as a connection to the lamp body to convey the lamp's touch signal to the touch-sensitive circuit. Moreover, these connections add assembly time to the lamp, and the wire splices used can be a hazard, particularly with all-metal lamp bodies. Furthermore, repair and replacement of the touch module can also be difficult and expensive, requiring disassembly or removal of the lamp base to gain access to the module. In addition, the modules' large size and wiring has often made installation in small lamps, solid-body lamps, and transparent lamps impractical or impossible due to lamp size or styling constraints.

A more recent approach for converting a table lamp to touch control has been to provide a touch control adapter which screws into the existing light socket, between the light bulb and its socket. Typically, a single clip-on wire or external spring is used to contact the shade support (harp) or outer surface of the light socket housing (shell) to couple the touch signal to the adapter's circuit. This approach is primarily intended for the do-it-yourselfer, whereby the user can convert existing table lamps to touch control use. However, adapters add inches to the height of the light bulb thereby interfering with many short-harp designs or globe shades which require the lamp's filament to be centered for even light distribution. Furthermore, the adapter's clip-on wire may be disturbed by unfamiliar users who attempt to turn on the lamp in a conventional manner. Lamp manufacturers view the adapter as an after-market add-on, not intended for lamp manufacturing use, which is expensive, i.e. adding the cost of male and female screw-in threads in addition to the cost of an already costly touch control circuit.

Consequently, a need still remains for a fresh approach to converting a lamp, such as an ordinary table lamp, to touch control. The objective of such an approach should be to avoid the drawbacks and shortcomings of the above-described prior art approaches without introducing new ones in their place. Also, such an approach should seek to have substantially universal applicability to all types of lamps and require minimal skill on the part of the installer in converting the lamp to touch control.

SUMMARY OF THE INVENTION

The present invention provides an electronic touch control light socket designed to satisfy the aforementioned long-felt needs. The touch control socket converts ordinary lamps, such as a table lamp, to touch control use which installs directly in the lamp in place of an ordinary light socket, and is "wireless" in the sense that the device eliminates all wiring related to touch control conversion. Therefore, a separate bulky module is eliminated and the position of the light bulb within the lamp remains unchanged. The touch control socket includes a touch-sensitive electrical circuit having a self-compensating capacitance subcircuit which detects touches by monitoring changes in lamp capacitance, making the device compatible with virtually any lamp design. Also, in place of the conventional pushbutton or rotatable on/off switch, a rotatable control knob can be incorporated into the touch control socket to select its desired operating mode, such as an on/off dim level or one of several dimmer sequencing modes.

The present invention is thus directed to a touch control light socket for converting a lamp to touch-sensitive operation, wherein the device includes a nonconductive circuit housing and a conductive light bulb insertion socket mounted on the circuit housing in overlying relation thereto. The circuit housing and insertion socket together are adapted for installation within a standard light socket shell in place of a standard light socket. The device also includes a touch sensing electrical circuit disposed in the circuit housing and having conductive means being adapted for electrical connection to the a.c. supply conductors of the lamp. The circuit is adapted to control a light bulb inserted into the insertion socket of the device upon receipt of a touch-responsive electrical input signal. Further, the device includes conductive contact means electrically connected to the circuit and being electrically coupled to a conductive exterior portion of the lamp when the circuit housing and insertion socket are installed within the light socket shell. In such manner, the contact means is adapted to convey to the circuit the touch-responsive electrical input signal generated when a person touches the conductive exterior portion of the lamp.

More particularly, the conductive contact is attached to the circuit housing so as to project from the exterior thereof such that the contact is capable of being disposed between the exterior of the circuit housing and the interior surface of the light socket shell and in electrical contact with a conductive portion of the light socket shell when the circuit housing and insertion socket are installed within the light socket shell. The conductive contact is thereby inaccessible from the exterior of the lamp and adapted to convey to the circuit an electrical touch-responsive signal generated when a person touches a conductive exterior portion of the lamp being electrically connected to the conductive portion of the light socket shell. In one form, the conductive contact is a contact spring. The conductive means of the circuit for power is in the form of a pair of electrical terminals defined on the exterior of the circuit housing and adapted for connection to the a.c. supply conductors of the lamp. The terminals are located on opposite sides of the circuit housing and are displaced about the housing away from the location of the conductive contact spring.

Still further, the touch sensing electrical circuit of the device includes an a.c. switching device, a capacitance detection and compensation subcircuit, level detection means, and an operating mode control subcircuit. The a.c. switching device is electrically connected in series with the light bulb of the lamp when inserted into the insertion socket of the device and has bi-directional conducting and nonconducting states wherein the bulb is respectively turned "on" and "off" during the a.c. voltage half-cycle to control lamp intensity. The capacitance detection and compensation subcircuit is electrically connected to the conductive contact for detecting a touch-responsive signal by monitoring changes in lamp capacitance conveyed thereto via the conductive contact. The detection and compensation subcircuit has a fast-responding touch-sensitive capacitance circuit portion and a slow-responding ambient-sensitive capacitance circuit portion which produce opposing-polarity signals which vary in response to changes in lamp capacitance. The level detection means is connected to the capacitance detection and compensation subcircuit for receiving the opposing-polarity signals therefrom and summing the same for producing a compensated detection signal wherein the effects of varying ambient conditions have been substantially eliminated and the magnitude thereof is either less than a predetermined voltage level which represents nondetection of the touch-responsive input signal or equal to or greater than the predetermined voltage level which represents detection of the touch-responsive input signal. The compensated detection signal, when less than the predetermined level and applied to the level detection means, causes the detector output to remain "off"; whereas the signal, when at or greater than the predetermined level and applied to the level detector, causes the detector output to turn "on".

The operating mode control subcircuit is electrically connected to the a.c. switching device and the level detection means and provides selectable dimmer sequencing modes as required. The operating mode control subcircuit receives the changing output signal from the level detection means and steps the mode control dimming logic to the next control state in response to each change of the compensated signal from below to above the predetermined level. The mode of the operating mode control subcircuit is selectable for ON/OFF, 4-Level, or 5-Level dimmer sequencing by a manually-operable control knob extending from the circuit housing and through an opening in the standard light socket shell previously occupied by a standard light switch of the standard light socket. The control knob is disposed adjacent to and above the conductive contact on the circuit housing.

Accordingly, it is an object of the present invention to provide a touch control light socket having a circuit housing with a light bulb insertion socket attached thereto which both can replace the standard light socket of a lamp in converting the lamp to touch control; to provide a conductive contact on the circuit housing which projects therefrom to electrically couple with the lamp exterior when the circuit housing and insertion socket are disposed inside the light socket shell of the lamp; to provide the conductive contact between the circuit housing and the light socket shell such that the conductive contact is completely hidden and inaccessible from the exterior of the lamp; to provide a touch-sensitive circuit in the circuit housing having a capacitance detection and compensation subcircuit which, in sensing a touch-responsive electrical signal, automatically compensates for changes in lamp capacitance as a result of varying ambient conditions; to provide circuit terminals on the circuit housing which are displaced away from the conductive contact thereon; and to provide an operating mode control subcircuit in the touch-sensitive circuit with a control knob which extends from the circuit housing and through the light socket shell of the lamp in place of an on/off push-button.

BRIEF DESCRIPTION OF THE DRAWINGS

FIG. 3 is a side elevational view, partly in section, of the device by itself;

FIG. 4 is another side elevational view, partly in section, of the device rotated ninety-degrees clockwise from its position in FIG. 3 about a vertical axis; and FIG. 5 is a schematic diagram of the device showing the touch sensing electrical circuit.

DETAILED DESCRIPTION OF THE PREFERRED EMBODIMENT

Figure 1:
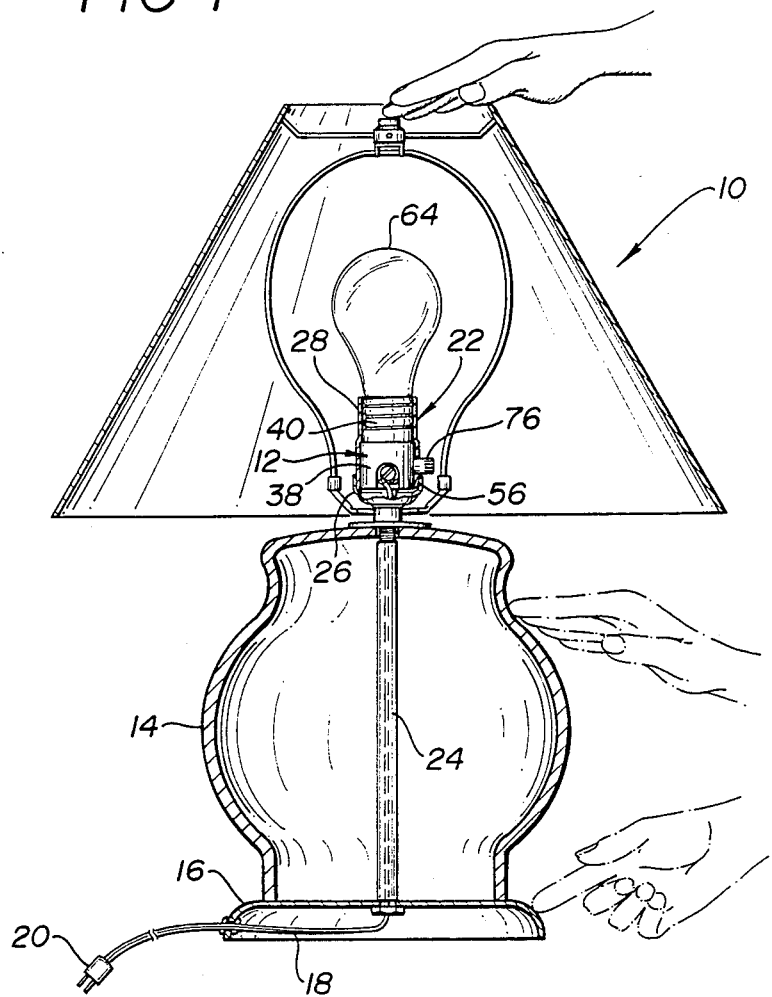
FIG. 1 is a schematical representation of a table lamp having the touch control light socket of the present invention installed in the lamp.
Figure 2:
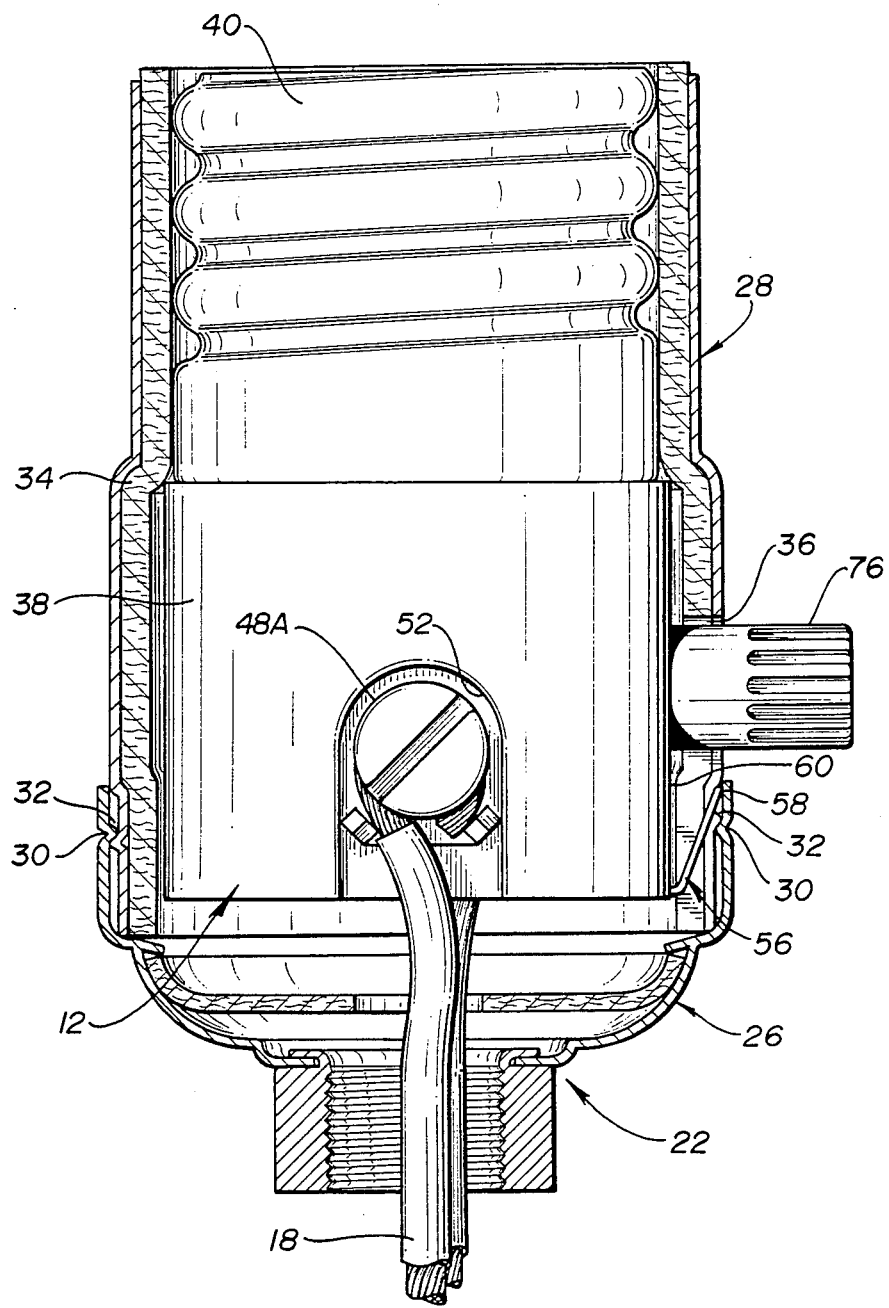
FIG. 2 is an enlarged elevational view, partly in section, of the device mounted inside the light socket shell of the lamp of FIG. 1.

Referring to FIGS. 1 and 2 of the drawings, there is illustrated a typical table lamp 10 with a preferred embodiment of the touch control light socket 12 of the present invention installed in the lamp 10 in place of a conventional light socket. The table lamp 10 conventionally has a body 14 supported upright on a base 16 which rests on a support surface, such as a table (not shown). An a.c. supply conductor cord 18 typically has a polarized plug 20 on one end which inserts into an electrical outlet (not shown). To convert the lamp 10 to touch-sensitive control operation, the touch control light socket 12 is installed inside the light socket's shell 22. The a.c. supply conductor cord 18 typically runs upwardly through a central pipe 24 in the lamp body 14 and connects at its opposite end to the touch control light socket 12.

The light socket shell 22 of the lamp 10 includes a shell base 26 attached to the upper end of the lamp body 14 and a shell body 28 disposed at its lower end in the shell base 26 and retained therein by crimps 30 which snap into openings 32 in the lower end of the shell body 28. A tubular liner 34 of a nonconductive material such as cardboard is inserted into the shell 22 and has an elongated opening 36 cut therein which ordinarily allows extension of an on/off light switch (not shown) therethrough for access by a user. The light switch normally part of the light socket (not shown), is now replaced by the touch control socket 12.

Thus, the touch control light socket 12, sized to be compatible with most standard light socket shells, takes the place previously occupied by a conventional light socket within the socket shell 22 of the lamp 10. As best seen in FIGS. 3 and 4, the device 12 includes an electrically nonconductive circuit housing 38, fabricated of any suitable heat-resistant plastic, and a light bulb screw-in or insertion socket 40 attached to the top of the circuit housing 38, such as by rivets 42. Therefore, it is the circuit housing 38 and the insertion socket 40 together which are installed within the light socket shell 22 of the lamp 10 in place of its conventional light socket.

The touch control light socket 12 further includes a touch-sensing electrical circuit 44 (of FIG. 5), preferably formed on a circuit board 45 and mounted within and across the lower portion of the circuit housing 38. In such location, the circuit 44 is displaced as far as possible away from the heat produced by the light bulb in the insertion socket 40 of the device 12. A bottom cover 46 fits within and closes the lower end of the circuit housing 38. A pair of electrical screw terminals 48A,48B are threadably mounted and fit into the circuit housing 38 with the heads 50 thereof disposed within recessed or cutout regions 52 defined on the housing exterior so that the terminal heads 50 will not interfere with installation of the circuit housing 38 within the light socket shell 22. The threaded ends 54 of the screw terminals 48A,48B are electrically connected to the circuit 44, whereas the heads 50 are electrically connected respectively to the "hot" and "neutral" conductor leads of the a.c. supply conductor cord 18 (FIG. 2).

The electrical screw terminals 48A,48B are positioned low on the circuit housing 38 and, as mentioned, are recessed to facilitate hook-up. Both terminals are displaced ninety-degrees with respect to the touch input spring contact 56 to provide maximum clearance distances in the event the leads of the conductor cord 18 stray during hook-up.

Still further, the touch control light socket 12 includes conductive contact means, preferably in the form of a resilient electrical leaf spring contact 56, which is supported by the circuit housing 38 and electrically connected to the sensing circuit 44 thereon. The spring contact 56 is then attached to and extends through the circuit housing 38, and at its outer end portion 58 extends along and projects outwardly from the side 60 of the circuit housing 38. As shown in FIG. 2, the spring contact 56 is thus disposed for placement between the exterior side 60 of the circuit housing 38 and the interior side of the light socket shell 22, and can be aligned with the opening 36 in the cardboard liner 34, so as to extend therethrough, when the touch control socket 12 is installed within the light socket shell 22. The spring contact 56 makes electrical contact with the shell base 26 which is fabricated from an electrically conductive material. The shell base 26 is, in turn, connected to other electrically conductive exterior portions of the lamp 10, such as the base 16 via the conductive central pipe 24. When the circuit housing 38 and insertion socket 40 are installed within the light socket shell 22, the spring contact 56 is thereby completely hidden, being inaccessible from the exterior of the lamp 10. By virtue of the spring contact 56, the need for an exterior wire or clip is eliminated. The spring contact 56, coupled to the shell base 26, is adapted to convey to the circuit 44 an electrical touch sensing signal generated when a person touches an electrically conductive exterior portion of the lamp 10 which is electrically connected to the light socket shell base 26.

It should be understood that the spring contact 56 can take the form of the leaf spring, shown in FIG. 3, or of any spring-like mechanism, such as a spring wire or a conductive plastic pad or finger.

Contact from the socket shell 22 to the exterior of the lamp 10 can be accomplished in various ways. The attachment of the socket shell 22 to the lamp body 14 is sufficient for metal lamps. For wood lamps, the center pipe 24 may be used to convey the signal from the lamp's metallized base to the socket shell. Many other styles of lamps also use this pipe concept to hold the various lamp parts together. For ceramic lamps, the entire lamp body can be made conductive through conductive chemical coatings.

Referring now to FIG. 5, the touch sensing electrical circuit 44 basically includes an a.c. switching device 62, such as a triac, electrically connected in series with a light bulb 64 of the lamp 10 when the latter is inserted into the insertion socket 40 of the touch control socket 12. The a.c. switching device 62 has bi-directional conducting and nonconducting states wherein the light bulb 64 is respectively turned "on" and "off" during the a.c. voltage half-cycle as required to control lamp intensity. Using low-power LSI circuitry and pulsed triac gating, the primary heat generating source within the circuit 44 is the triac 62. Heat is conducted away from the triac 62 by way of one of the screw terminals 48. The triac's heatsink tab, which is electrically isolated from the triac, fastens directly to the terminal 48 for maximum heat transference. Although either the "hot" 48A or "neutral" 48B terminals could be used for heat conveyance, the "hot" terminal 48A is preferred since it is already common to the triac's input. In this manner, breakdown in insulation between the triac's junction and the triac's mounting tab merely causes the light bulb 64 to remain on indefinitely. This mode of failure is, however, preferable to an across-the-line short that would occur if the triac 62 were mounted to the neutral terminal 48B. The heatsink terminal reduces the triac's heat rise without bringing heat into the circuit 44, thus adding to the reliability of the entire unit.

In addition, the circuit 44 includes an operating mode control subcircuit (U1) 66, being preferably in the form of a standard LSI circuit designated LS7237 and commercially available from LSI Computers Systems, Inc. The mode control subcircuit 66 is electrically connected at Pin 8 to the triac 62 through a diode D4. Operation of the mode control subcircuit 66 will be described in greater detail later.

Further, a capacitance detection and compensation subcircuit 68 is electrically connected to the spring contact 56 for detecting a touch-responsive signal generated by a person touching a conductive portion of the lamp 10.

Capacitive sensing is accomplished by monitoring the amount of current flowing through the touch sensor input to earth ground. Voltage necessary to detect this capacitance is provided by operation of the circuit 44 from the "hot" side of the a.c. supply conductor. For this reason, line polarity (i.e. hot and neutral hook-up) is important for proper sensing. If the polarized plug 20 is used however, correct polarity is automatically assumed. U.L. already requires that all lamps use such a plug to protect the user from shock during relamping. The subcircuit 68 monitors changes in lamp capacitance conveyed thereto via the spring contact 56. Wore particularly, resistors R1,R2 of the subcircuit 68 develop a signal across resistor R3, whose amplitude is proportional to the amount of capacitance between the touch sensor input and earth ground. Resistors R1,R2 limit the sensing current to less than 40 microamps, which is unperceivable by most users. The redundant resistor design serves to protect the user from shock in the event one of the resistors becomes shorted for whatever reason. Resistor R3 is chosen to limit the amount of signal to a reasonable level when operating with large-capacity lamps.

Resistive current-limiting at the touch sensor input provides several advantages over capacitively coupled schemes. Whereas capacitors consist of parallel plates separated by extremely thin insulators, resistors use a resistive film path spread out over a large distance. Resistor construction is therefore inherently safer in current-limiting applications, and provides better protection against static-electric discharge, adding to the overall safety and reliability of the circuit. Such static-discharges can occur when the user walks across a carpet and touches the lamp. Effective current-limiting also reduces the amount of "shock" felt during such static discharges.

Resistive limiting also reduces problems with contact resistance between the touch input spring 56 and the socket shell base 26, and the other interconnecting metal parts of the lamp 10. In the circuit presented herein, sensor input resistance has a negligible effect since it is only a small percentage of the total input resistance. Some capacitively-based touch designs cannot tolerate even 10 K of input resistance, making them unreliable for spring contact designs.

Lastly, resistors offer a constant impedance over frequency. The circuit uses this resistance in a low-pass filter to attenuate most common RF noise sources. Capacitively-based input designs offer no such filtration, and consequently suffer from noise pick-up from radio transmitters, local television oscillators, wireless intercoms, etc., causing false triggering.

Still further, the detection and compensation subcircuit 68 is composed of two different time-constant circuit portions, a touch-sensitive capacitance circuit portion 70 and an ambient-sensitive capacitance circuit portion 72, which produce opposing-polarity signals which vary in response to changes in lamp capacitance. Specifically, C1,D1 and C2,D2, in conjunction with input resistors R1,R2, form the touch and ambient delays, respectively, of the circuit portions 70,72.

Also, the circuit 44 includes a level detector means 74 connected to the operating mode control subcircuit 66 and to the capacitance detection and compensation subcircuit 68 for receiving the opposing-polarity signals therefrom and resistively summing the same for producing a compensated detection signal wherein the effects of varying ambient conditions have been substantially eliminated. Specifically, the opposing-polarity outputs from both circuit portions 70,72 are summed together by resistors R4,R5 and applied to the base of transistor Q1. If it is assumed that the lamp capacitance signal on the circuit input is steady, and that the summing resistors R4,R5 are equal and neglecting resistor R6, the sum of the opposing voltages developed across C1 and C2 is zero and Q1's collector remains OFF, outputting a logic-0 (Vdd) to U1 Pin 5. This zero voltage represents nondetection of a touch responsive signal.

If, however, the circuit input sees a sudden increase in lamp capacitance, caused by a person touching the lamp 10, the voltage across R3 increases, causing both C1 and C2 to begin charging to a higher level. Because the time delay of touch circuit portion 70 is much shorter than the time delay of ambient circuit portion 72, the voltage across C1 charges more quickly, causing the voltage at the base of transistor Q1 to fall. If the voltage drops to a given level (in this case the Vbe level of Darlington Q1) then transistor Q1 conducts, dumping the charge on filter capacitor C4 and outputting a logic-1 (Vss) signal to Pin 5 of the mode control circuit (U1) 66, indicating that a touch-responsive input signal has been detected. This output persists until the voltage on ambient delay capacitor C2 can rise sufficiently to cancel the touch delay signal voltage imbalance. Resistor R6 provides a small imbalance in the summing impedances to bias transistor Q1 closer to its turn-on voltage, increasing the sensitivity of the circuit 44. Component C3 is a high-frequency bypass capacitor to attenuate RF noise at the circuit input.

Therefore, the circuit 44 senses touch by detecting increases in lamp capacitance seen on the input the moment the user touches the lamp. The amount of capacitance increase will vary, depending on the person's body capacitance which is related to body size and position relative to the earth ground, and the amount of capacitance and resistive coupling provided by the touch. In general, however, the amount of increase is usually significant even for large-capacity lamps.

A simple fixed-threshold capacitance detection scheme, such as that recommended by the manufacturer of U1, would not really be practical for touch lamps since the lamps themselves will vary in capacitance, causing random turn-on. Variables for capacitance include the size of the lamp, its composition, placement, and room humidity. For this reason the circuit 44 has an automatic-sensing compensation subcircuit 68, as just described, which eliminates effects of slowly varying ambient conditions on the touch control circuit's sensitivity.

The dimming control logic of the circuit 44 is built around the operating mode control circuit (U1) 66, a standard LSI chip identified earlier, which is specifically designed for touch control dimmers. The dimming logic advances the dim level to the next step each time the voltage on U1's Pin 5 rises with each detected touch. The circuit 66 uses a standard single-filament light bulb 64 and varies the lamp brightness by phase-controlling the power to the lamp's filament. The circuit 66 delays the turn "on" of the triac 62 so many milliseconds every half-cycle of the a.c. line, thus reducing the voltage to the lamp to produce the desired dim-intensity level.

Pin 2 of circuit 66, in conjunction with a potentiometer R8, is used to select the dimming logic's operating mode: ON/OFF (Pin 2=Vss), 4-Level Dimming (Pin 2=Vdd), or 5-Level Dimming (Pin 2=½ Vss). A potentiometer is used instead of a switch to reduce vibration during mode changes for better reliability. Components R9 and C6 condition the a.c. line signal input to Pin 4 of the circuit 66. This signal is used to monitor the a.c. line to synchronize U1's internal phase-locked loop to the a.c. current's zero-crossing. A counter inside of the circuit 66 keeps track of the phase angle of the a.c. cycle, comparing it with the desired dimming angle stored in its memory. At the appropriate time a gate pulse is delivered to the triac 62 which turns "on" the triac for the remainder of that half-cycle. Because the phase angle is digitally derived, dim levels are consistent from one device to the next, even for very low dim levels.

Components R10, D3, VR1 and C7 form a regulated half-wave power supply for the circuit 44. Because the circuit uses low power LSI circuitry and pulsed triac gating, quiescent power for the circuit is typically only 0.35 Watts. Resistive current-limiting is used in the power supply for greater reliability.

The operating mode control subcircuit 66 is actuatable by a manually-operable control knob 76 extending from the circuit housing 38 and through the opening 36 in the light socket shell 22 previously occupied by a standard light switch of the standard lamp socket now replaced by the circuit housing 38 and insertion socket 40. The control knob 76 is disposed adjacent to and above the spring contact 56 on the circuit housing 38. The knob 76 is connected to potentiometer R8 of the circuit 44 and is rotated to change the voltage applied to mode select Pin 2. The control shaft 78 of the knob 76 is notched to prevent axial movement. This serves to protect the circuit 12 from damage caused by someone mistakenly pressing in on the knob in an attempt to turn "on" the light in a conventional manner. However, it should be understood that the control shaft and knob 78,76 may be omitted if not required, by using a non-switching light socket shell. For this, a cardboard switch liner 34 would still be used to permit spring contact with the light socket shell. The operating mode control R8 would be omitted and U1's Pin 2 wired directly to Vdd, Vss, or left disconnected for the desired mode of operation.

Having thus described the electronic touch control light socket of the present invention in detail and by reference to a preferred embodiment thereof, it will be apparent that modifications and variations are possible without departing from the scope of the invention defined in the appended claims.

What is claimed is:

1. A touch control light socket for use in converting a lamp to touch-sensitive operation, said touch control socket comprising:
    a nonconductive circuit housing;
    a conductive light bulb insertion socket mounted on said circuit housing in overlying relation thereto;
    said circuit housing and insertion socket together being adapted for installation within a standard light socket shell of a lamp in place of a standard light socket;
    a touch sensing electrical circuit disposed in said circuit housing and having conductive terminal means being exposed at the exterior of said circuit housing and adapted for electrical connection to the a.c. supply conductors of the lamp, said circuit being adapted to control the intensity of a light bulb inserted into said insertion socket upon receipt of a touch-responsive electrical input signal; and
    conductive contact means electrically connected to said circuit and being electrically coupled to a conductive exterior portion of the lamp when said circuit housing and insertion socket are installed within a standard light socket shell such that said contact means is adapted to convey to said circuit the touch-responsive electrical input signal generated when a person touches the conductive exterior portion of the lamp.

2. The touch control socket of claim 1 in which said touch sensing electrical circuit includes:
    an a.c. switching device electrically connected in series with a light bulb of the lamp when the bulb is inserted into said insertion socket and having bi-directional conducting and nonconducting states wherein the bulb is respectively turned "on" and "off" during the a.c. voltage half-cycle as required to control lamp intensity;
    a capacitance detection and compensation subcircuit electrically connected to said contact means for detecting a touch-responsive signal by monitoring changes in lamp capacitance conveyed thereto via said contact means, said compensation subcircuit having a fast-responding touch-sensitive capacitance circuit portion and a slow-responding ambient-sensitive capacitance circuit portion which produce opposing-polarity signals which vary in response to changes in lamp capacitance; and
    level detection means connected to said capacitance detection and compensation subcircuit for receiving said opposing-polarity signals therefrom and summing the same for producing a compensated detection signal wherein the effects of varying ambient conditions have been substantially eliminated and the magnitude thereof is either less than a predetermined level which represents nondetection of the touch-responsive input signal or equal to or greater than said predetermined level which represents detection of the touch-responsive input signal such that when said compensated signal less than said predetermined level is applied to said level detection device, said compensated signal causes the detector output to remain "off", whereas when said compensated signal at or greater than said predetermined level is applied to the level detector, said compensated signal causes the detector output to turn "on".

3. The touch control socket of claim 2 in which said circuit further includes:
    an operating mode control subcircuit including mode control dimming logic, said operating mode control subcircuit electrically connected to said a.c. switching device and said level detector means and providing selectable multiple-dimming modes as required, said operating mode control subcircuit receiving said changing output signal from said level detector means and stepping said mode control dimming logic to the next control state in response to each change of said compensated signal from below to above said predetermined level.

4. The touch control socket of claim 3 in which said multiple selectable dimming modes are ON/OFF, 4-Level, or 5-Level dimmer sequences.

5. The touch control socket of claim 2 in which said a.c. switching device is a triac.

6. A touch control light socket for use in converting a lamp to touch-sensitive operation, said touch control socket comprising:
    a nonconductive circuit housing;
    a conductive light bulb insertion socket mounted on said circuit housing in overlying relation thereto;
    said circuit housing and insertion socket together being adapted for installation within a standard light socket shell of a lamp in place of a standard light socket;
    a touch-sensing electrical circuit disposed in said circuit housing and having terminal conductive means being adapted for electrical connection to the a.c. supply conductors of the lamp, said circuit being adapted to control the intensity of a light bulb inserted into said insertion socket upon receipt of a touch-responsive electrical signal; and
    a conductive contact electrically connected to said circuit and attached to said circuit housing so as to project from the exterior thereof such that said contact is capable of being disposed between the exterior of said circuit housing and the interior surface of the light socket shell and in electrical contact with a conductive portion of the light socket shell when said circuit housing and insertion socket are installed within the light socket shell, said contact thereby being inaccessible from the exterior of the lamp and being adapted to convey to said circuit an electrical touch-responsive signal generated when a person touches a conductive exterior portion of the lamp being electrically connected to the conductive portion of the light socket shell.

7. The touch control socket of claim 6 in which said conductive contact is a spring device.

8. The touch control socket of claim 6 in which said conductive terminal means of said circuit is in the form of a pair of electrical terminals defined on the exterior of said circuit housing being adapted for connection to the a.c. supply conductors of the lamp and located on opposite sides of said circuit housing displaced about said housing from said conductive contact thereon.

9. The touch control socket of claim 6 in which said touch sensing electrical circuit includes:
  an a.c. switching device electrically connected in series with a light bulb of the lamp when the bulb is inserted into said insertion socket and having bi-directional conducting and nonconducting states wherein the bulb is respectively turned "on" and "off" during the a.c. voltage half-cycle as required to control lamp intensity; and
  a capacitance detection and compensation subcircuit electrically connected to said conductive contact for detecting a touch-responsive signal by monitoring changes in lamp capacitance conveyed thereto via said conductive contact, said compensation subcircuit having a fast-responding touch-sensitive capacitance circuit portion and a slower-responding ambient-sensitive capacitance circuit portion which produce opposing-polarity signals which vary in response to changes in lamp capacitance; and
  level detection means connected to said capacitance detection and compensation subcircuit for receiving said opposing-polarity signals therefrom and summing the same for producing a compensated detection signal wherein the effects of varying ambient conditions have been substantially eliminated and the magnitude thereof is either less than a predetermined voltage level which represents nondetection of the touch-responsive input signal or equal to or greater than said predetermined level which represents detection of the touch-responsive input signal such that when said compensated signal less than said predetermined level is applied to said level detector means, said compensated signal causes the detector output to remain "off", whereas when said compensated signal at or greater than said predetermined level is applied to the level detector, said compensated signal causes the detector output to turn "on".

10. The touch control socket of claim 9 in which said circuit further includes:.
  an operating mode control subcircuit electrically connected to said a.c. switching device and said level detection means and being selectable to provide multiple dimming modes as required, said operating mode control subcircuit receiving said changing output signal from said level detection means and stepping the mode control dimming logic to the next control state in response to each change of said compensated signal from below to above said predetermined level.

11. The touch control socket of claim 10 in which said operating mode control subcircuit is selectable by a manually-operable control knob extending from said circuit housing and through an opening in the standard socket shell previously occupied by a standard light switch of the standard light socket now replaced by said circuit housing and insertion socket.

12. The touch control socket of claim 11 in which said control knob is disposed adjacent to and above said conductive contact on said circuit housing.

13. The touch control socket of claim 10 in which said multiple selectable dimming modes are ON/OFF, 4-Level, or 5-Level dimmer sequences.

14. The touch control socket of claim 9 in which said a.c. switching device is a triac.

15. An electronic touch control light socket for use in converting a lamp to touch-sensitive operation, said touch control socket comprising:
  an electrically nonconductive circuit housing having a top, bottom and side extending between and interconnecting its top and bottom;
  a light bulb insertion socket mounted to said top of said circuit housing;
  said circuit housing and insertion socket together being adapted for installation within a light socket shell of a lamp in place of a standard light socket;
  a touch sensing electronic circuit disposed in said circuit housing and having electrical terminals defined on the exterior of said circuit housing being adapted for connection to the a.c. supply conductors of a lamp; and
  a resilient electrical spring contact electrically connected to said circuit and being attached to said circuit housing and extending along said side thereof for placement between the exterior of said circuit housing and the interior of a standard light socket shell and in electrical contact with an electrically conductive portion of the light socket shell when said circuit housing and insertion socket are installed within the light socket shell, said spring contact thereby being inaccessible from the exterior of the lamp and being adapted to convey to said circuit an electrical touch sensing signal generated when a person touches an electrically conductive exterior portion of the lamp electrically connected to the electrically conductive portion of the light socket shell.

16. The touch control socket of claim 15 in which said touch sensing electrical circuit includes:
  an a.c. switching device electrically connected in series with the light bulb of the lamp when inserted into said insertion socket and having bi-directional conducting and nonconducting states wherein the bulb is respectively turned "on" and "off" during the a.c. voltage half-cycle as required to control lamp intensity;
  an operating mode control subcircuit electrically connected to said a.c. switching device and being actuatable to select various dimmer sequencing modes;
  a capacitance detection and compensation subcircuit electrically connected to said spring contact for detecting a touch-responsive signal by monitoring changes in lamp capacitance conveyed thereto via said spring contact, said compensation subcircuit having a fast-responding touch-sensitive capacitance circuit portion and a slower-responding ambient-sensitive capacitance circuit portion which produce opposing-polarity signals which vary in response to changes in lamp capacitance; and level detection means connected to said operating mode control subcircuit and to said capacitance detection and compensation subcircuit for receving said opposing-polarity signals therefrom and summing the same for producing a compensated detection signal wherein the effects of varying ambient conditions have been substantially ekiminated and the magnitude thereof is either less tham a predetermined voltage level which represents nondetection of the touch-responsive input signal, or equal to or greater then said predetermined level signal;

said operating mode control subcircuit receiving said changing detector output signal from said level detection means and stepping the mode control dimming logic to the next control state in response to each change of said compensated signal from below to above said predetermined level.

17. The touch control socket of claim 16 in which said operating mode control subcircuit is actuatable by a manually-operable control knob extending from said circuit housing and through an opening in the light socket shell previously occupied by a standard light switch of the standard light socket now replaced by said circuit housing and insertion socket.

18. The touch control socket of claim 17 in which said control knob is disposed adjacent to and above said conductive contact on said circuit housing.

* * * * *

UNITED STATES PATENT AND TRADEMARK OFFICE
CERTIFICATE OF CORRECTION

PATENT NO. : 4,764,708

DATED : August 16, 1988

INVENTOR(S) : Charles A. Roudeski

It is certified that error appears in the above-identified patent and that said Letters Patent is hereby corrected as shown below:

Title page:

Abstract, line 1 "electric" should be --electronic--.
Column 13, line 12 "ekiminated" should be --eliminated--.
Column 13, line 13 "tham" should be --than--.
Column 13, line 17 "then" should be --than--.
Column 13, line 17 after "level" insert --which represents detection of the touch-responsive input--.

Signed and Sealed this

Seventh Day of March, 1989

Attest:

DONALD J. QUIGG

*Attesting Officer*   *Commissioner of Patents and Trademarks*